Figure 1A:
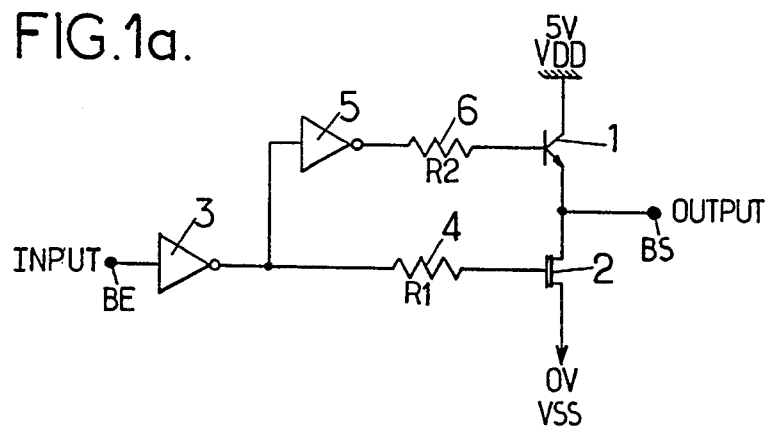

United States Patent [19]
Hirschauer

[11] Patent Number: 5,361,004
[45] Date of Patent: Nov. 1, 1994

[54] TTL-CMOS OUTPUT STAGE FOR AN INTEGRATED CIRCUIT

[75] Inventor: Pierre Hirschauer, Montesson, France

[73] Assignee: Matra MHS, France

[21] Appl. No.: 7,135

[22] Filed: Jan. 21, 1993

[30] Foreign Application Priority Data

Jan. 20, 1992 [FR] France ............... 92 00542

[51] Int. Cl.⁵ .............. H03K 19/02; H03K 19/092
[52] U.S. Cl. ........................ 326/70; 326/68; 326/109; 326/21
[58] Field of Search ........... 307/475, 443, 446, 451, 307/456

[56] References Cited

U.S. PATENT DOCUMENTS

| | | | |
|---|---|---|---|
| 4,689,503 | 8/1987 | Suzuki et al. | 307/475 |
| 4,717,847 | 1/1988 | Nolan | 307/475 |
| 4,847,522 | 7/1989 | Fuller et al. | 307/475 |
| 4,975,600 | 12/1990 | Tran et al. | 307/475 |
| 4,983,862 | 1/1991 | Suzuki et al. | 307/475 |
| 5,087,841 | 2/1992 | Rogers | 307/475 |
| 5,132,569 | 7/1992 | Matsuda | 307/446 |

FOREIGN PATENT DOCUMENTS

| | | |
|---|---|---|
| 0307323 | 3/1989 | European Pat. Off. |
| 58-103230 | 6/1983 | Japan . |
| 60-224325 | 4/1984 | Japan . |
| 61-274512 | 12/1986 | Japan . |
| 62-230221 | 10/1987 | Japan . |

*Primary Examiner*—Edward P. Westin
*Assistant Examiner*—Richard Roseen
*Attorney, Agent, or Firm*—Larson and Taylor

[57] ABSTRACT

A TTL-CMOS output stage for an integrated circuit includes a bipolar transistor and a MOS transistor series connected between the power supply and ground, their common point forming the output terminal of the TTL-CMOS output stage. A first switching control input channel includes an inverter whose input forms the input terminal of the stage and whose output is connected to the gate of the MOS transistor via a resistor. A second switching control input channel includes a second inverter controlled by the first inverter and whose output is connected to the base of the bipolar transistor by means of a second resistor. The resistors make it possible to limit the transient current and the mean current supplied by the bipolar transistor.

9 Claims, 3 Drawing Sheets

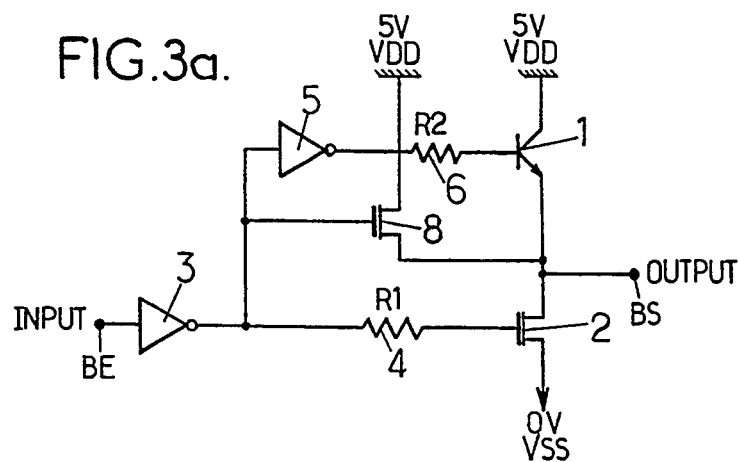
FIG.3a.
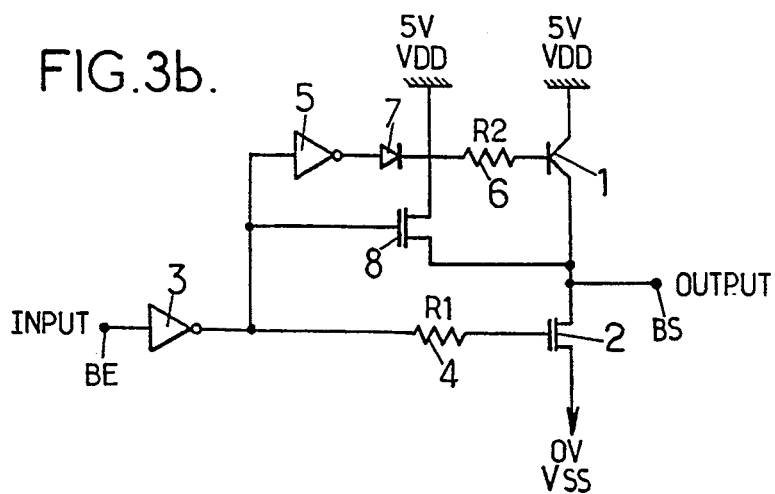
FIG.3b.
FIG.3c-1.
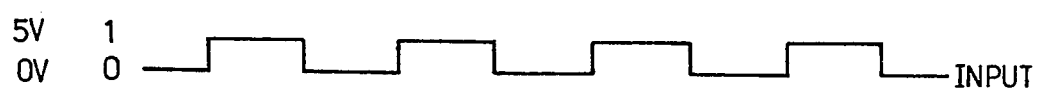
FIG.3c-2.
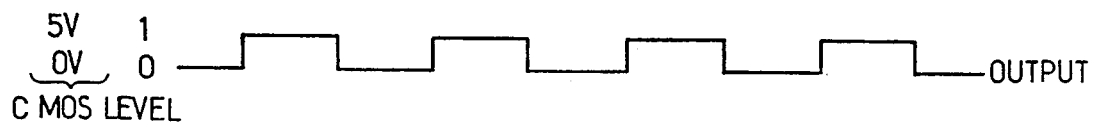

TTL-CMOS OUTPUT STAGE FOR AN INTEGRATED CIRCUIT

The invention relates to a TTL-CMOS stage, or buffer stage, for integrated circuits.

In current integrated circuits, the problem of interconnection of the kernel of the integrated circuit, carrying out the function for which the latter was designed, with the surrounding electronic circuits remains a major technical problem, by reason especially of the variety of the signal standards in voltage amplitude or current level which are likely to be required to provide transmission of these signals in satisfactory conditions over the latter.

Among the current signal standards, signals to the TTL (Transistor Transistor Logic) or CMOS standards are the most used. It will be recalled that in the case of signals to the TTL standards, the voltage amplitude of the signals lies between 5 V and 2.4 V for the high logic level and 0 V and 0.4 V for the low logic level, a current of 32 mA possibly being delivered, while in the case of signals to the CMOS standards, the voltage amplitude of these signals is substantially equal to 5 V for the high logic level and to 0 V for the low logic level.

The object of the present invention is the implementation of a TTL-CMOS output stage for an integrated circuit making it possible to bring about an adaptation of the logic signals delivered by the kernel of an integrated circuit, to the standards of the TTL or CMOS standard signals.

Another object of the present invention is the implementation of a TTL-CMOS output stage for an integrated circuit, exhibiting an input electrical capacitance of the order of 1 pF.

Another object of the present invention is the implementation of a low-noise TTL-CMOS output stage.

The TTL-CMOS output stage for an integrated circuit which is the subject of the present invention is noteworthy in that it comprises a bipolar transistor and an MOS transistor connected in series between the power supply voltage and the reference voltage, the common point of the bipolar transistor and of the MOS transistor forming the output terminal of the TTL-CMOS output stage. A first input control channel is provided and comprises a first inverter, whose input constitutes the input terminal of the TTL-CMOS stage and whose output is linked to the gate of the MOS transistor by means of a first resistor.

A second input control channel is provided, comprising a second inverter, whose inverting input is linked to the output of the first inverter and whose output is linked to the base of the bipolar transistor by means of a second resistor. The resistors have a value determined so as to limit, on the one hand, the transient current on switching and, on the other hand, the mean current supplied by the bipolar transistor.

The TTL-CMOS output stage which is the subject of the invention finds an application in the production of integrated circuits, more particularly buffer circuits or circuits for adapting logic signals arranged between the kernel of the integrated circuit proper and the housing of the latter.

Figures 1, 1B:
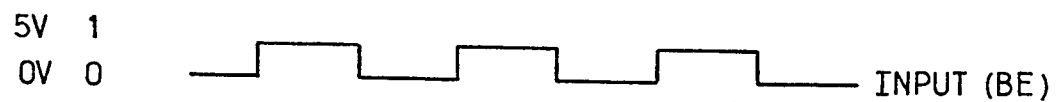
Figures 1, 1B, 2:
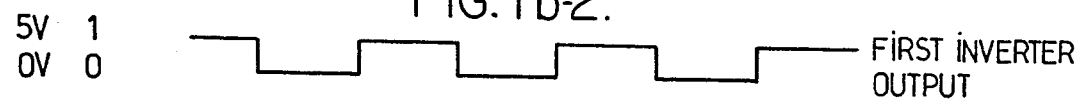
Figures 1, 1B, 2, 3:
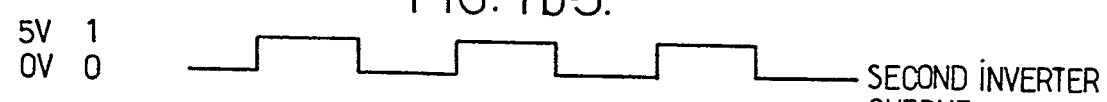
Figures 1, 1B, 2, 3, 4:
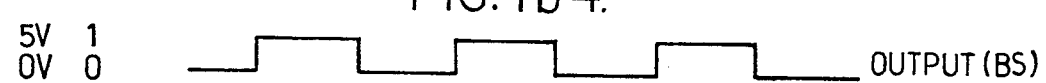
Figure 2A:
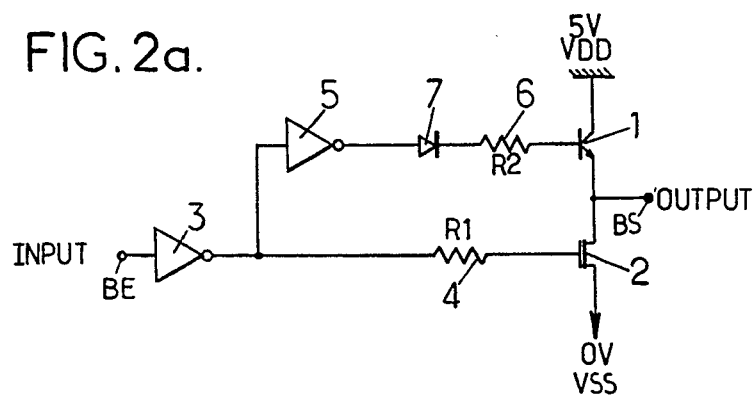
Figures 1, 2B:
Figures 2, 2B:
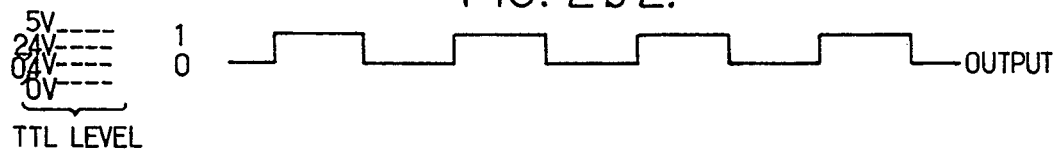
Figure 4:
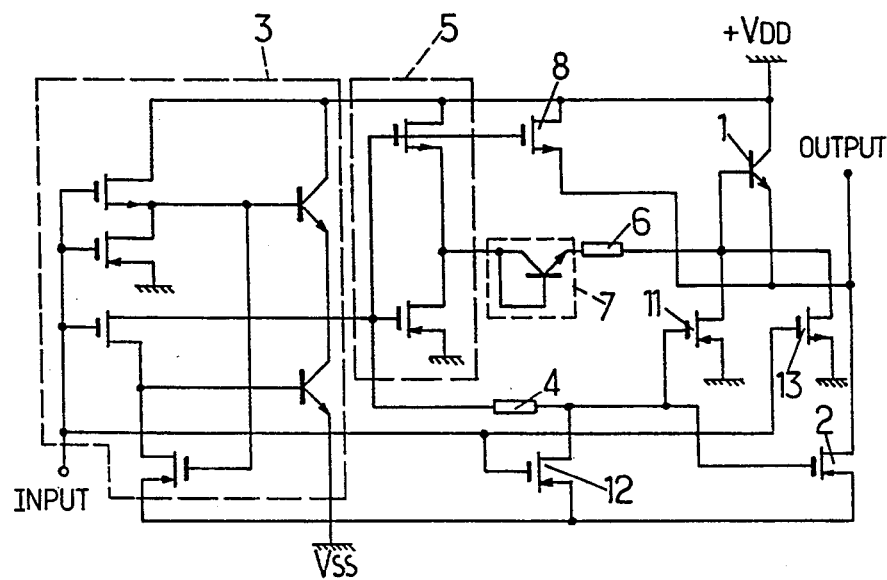

A more detailed description of the TTL-CMOS output stage for an integrated circuit according to the invention will be given below in the description and the drawings in which:

FIG. 1a represents a functional diagram of the TTL-CMOS output stage which is the subject of the present invention, FIGS. 1$b_1$ to 1$b_4$ collectively referred to as FIG. 1b, are timing diagrams for the signals obtained at various significant points in FIG. 1a, FIG. 2a represents an output stage in accordance with the subject of the present invention in an embodiment variant more particularly intended to adapt input logic signals to the TTL level, FIGS. 2$b_1$ and 2$b_2$, collectively referred to as FIG. 2b, are timing diagrams for signals obtained at significant points in FIG. 2a, FIG. 3a represents an output stage in accordance with the subject of the present invention in a first embodiment variant which is more particularly intended to adapt input logic signals to the CMOS level, FIG. 3b represents an output stage in accordance with the subject of the present invention in a second embodiment variant which is more particularly intended to adapt input logic signals to the CMOS level, FIGS. 3$c_1$ and 3$c_2$, collectively referred to as FIG. 3c, are timing diagrams for signals obtained at significant points identical to the first and second embodiments represented in FIGS. 3a and 3b, FIG. 4 represents, by way of non-limiting example, an embodiment and an installation of components allowing implementation of the embodiment of FIG. 3b.

The TTL-CMOS output stage for an integrated circuit which is the subject of the present invention will first of all be described in association with FIG. 1a.

As will be seen in the abovementioned figure, the TTL-CMOS output stage which is the subject of the present invention comprises, in a general way, a bipolar transistor 1 and a MOS transistor 2 connected in series between the power supply voltage, denoted VDD, and the reference voltage, earth, denoted VSS. By series connection of the bipolar 1 and MOS 2 transistors, it is understood that the emitter of the bipolar transistor 1 is connected to the drain of the MOS transistor 2. The common point of the bipolar transistor and of the MOS transistor forms the output terminal BS of the TTL-CMOS output stage.

In general, the power supply voltage VDD is taken to be equal to 5 volts.

Furthermore, as will be observed in the abovementioned FIG. 1a, the TTL-CMOS output stage which is the subject of the present invention comprises a first switching control input channel comprising a first inverter 3, whose input constitutes the input terminal BE of the TTL-CMOS stage, and whose output is linked to the gate of the MOS transistor 2 by means of a first resistor 4.

Furthermore, a second switching control input channel is provided and comprises a second inverter 5 whose input is linked to the output of the first inverter 3 and whose output is linked to the base of the bipolar transistor 1, by means of a second resistor 6. The resistors 4 and 6 have a value determined so as to limit, on the one hand, the transient current on switching, and, on the other hand, the means current supplied by the bipolar transistor 1.

A timing diagram of the signals generated at the significant point of the TTL-CMOS output stage which is the subject of the invention represented in FIG. 1a is represented in FIG. 1b. The input signals are logic signals delivered by the kernel of an integrated circuit. These logic signals have, in the usual way, a high logic level, denoted 1, and a low logic level, denoted 0, these logic levels corresponding to voltage values of 5 V and 0 V respectively, for a very low current level, of the order of a few microamperes. The inverters 3 and 5 may be produced respectively by a BICMOS inverter and by a CMOS inverter, which makes it possible to minimize the input capacitance of the TTL-CMOS output stage to a value of the order of 1 pF.

It will be noted that the CMOS or TTL operators used, downstream of the output stage which is the subject of the present invention, have only a dynamic consumption. This results in significant current demands on the power supply. The suitable choice of the value of the resistors 6 and 4, placed in the base circuits and gate circuits respectively, of the bipolar transistor 1 and of the MOS transistor 2, thus make it possible to produce low-noise TTL-CMOS output stages by limiting the slope of the output signal. In fact, the resistor 6 limits the base current of the bipolar transistor 1 and the resistor 4 introduces a capacitive timing constant factor onto the gate of the MOS transistor 2. For fast TTL-CMOS output stage versions, in accordance with the subject of the present invention, the values of the abovementioned resistors 4 and 6 may be made very small, or zero.

On the output terminal BS, the corresponding signal obtained is represented in FIG. 1b, this signal, needless to say, corresponding substantially to the input signals, but the current capable of being delivered by the output terminal BS being capable of attaining values of the order of 30 milliamperes. This current is, needless to say, delivered by the bipolar transistor 1.

Taking into account the standard of the TTL signals, it can clearly be understood that the signals delivered at the output of the output stage which is the subject of the present invention satisfy this standard.

However, with a view to increasing the switching speed at the TTL level, that is to say while remaining compatible with the standard of these signals, the second switching control input channel comprises a diode 7, as represented in FIG. 2a, downstream of the second inverter 5. This diode makes it possible to bring the value of the high logic level at the output of the output stage which is the subject of the present invention back to the value VDD-2Vbe. It will be recalled that Vbe represents the value of the base-emitter voltage of the bipolar transistor 1 in the conducting state.

In FIG. 2b is represented, on the one hand, the logic signals present on the input terminal BE, and, on the other hand, the signals present on the output terminal BS. It will be noted that, taking into account the presence of the diode 7, the amplitude of the output signals lies between 0 and about 3.2 V, which makes it possible, on the one hand, to satisfy the standard of the TTL signals, and, on the other hand, to reduce the transition time between the low logic level and the high logic level.

It will be noted that the diode 7 may be formed either by a silicon diode, or, by another bipolar transistor of smaller size than the bipolar transistor 1, since the base current is lower than that of the emitter and whose base and collector are linked in short-circuit.

In the embodiment of FIG. 2a, the compatibility with the standard of the TTL levels makes it possible to deliver a current of 32 milliamperes for the low level less than 0.4 V. With this aim, an MOS transistor of N type for example, the transistor 2, has been installed in order to provide the abovementioned low logic level, this MOS transistor being a wide transistor, whereas to provide the low logic level, the diode 7 and the bipolar transistor 1, an NPN transistor for example, make it possible to obtain the limitation of the voltage excursion for the increased switching speed sought.

An embodiment variant of the TTL-CMOS output stage which is the subject of the present invention will be given in association with FIGS. 3a and 3b in the case where it is necessary to provide switching compatibility to the CMOS level which has been mentioned previously in the description.

In a first corresponding embodiment variant, the output stage, such as represented in FIG. 3a, further comprises an auxiliary MOS transistor 8 whose drain electrode is linked to the power supply voltage VDD, and whose source electrode to the common point of the bipolar transistor 1 and of the MOS transistor 2. The gate electrode of the auxiliary transistor 8 is then linked to the output of said first inverter 3. The auxiliary transistor 8 makes it possible, when the latter enters into conduction, to impose the value of the power supply voltage VDD on the output point of the output stage which is the subject of the present invention.

It will be noted that, in the embodiment of FIG. 3a, the latter corresponds substantially to the embodiment of the output stage which is the subject of the present invention of FIG. 1a, to which the auxiliary transistor 8 has been added.

However, the embodiment of FIG. 3a is not limiting and, needless to say, the auxiliary transistor 8 may also be added to the embodiment of FIG. 2a in order to provide switching compatibility at the CMOS level.

In this case, as represented in FIG. 3b, the auxiliary MOS transistor 8 is connected in the same way as in the case of FIG. 3a. However, in the case of FIG. 3b, by reason of the presence of the diode 7, the auxiliary MOS transistor 8 must provide greater voltage reversion since, in this case, the output terminal BS, normally taken to the VDD-2Vbe potential by reason of the presence of the diode 7, is in fact taken back to the value of the power supply voltage VDD by the MOS transistor 8 in conduction, hence the greater voltage reversion carried out by the latter.

In FIG. 3c is represented a timing diagram of the signals present at the input, logic signals on the input terminal BE and the output signals respectively at the CMOS level between the voltage values 0 V and 5 V.

In the embodiments described in association with FIGS. 1a, 2a and 3a, in a non-limiting way, the bipolar transistor 1 is an NPN-type transistor, the MOS transistor 2 being an NMOS-type transistor. The auxiliary MOS transistor 8 is then a PMOS-type complementary transistor.

A more detailed description at the level of the components used for producing the TTL-CMOS output stage which is the subject of the present invention will be given in association with FIG. 4.

In a general way, it will be considered that the inverters 3 and 5 may be represented by BICMOS- or respectively CMOS-type inverters. For a more detailed description of the respective qualities of this inverter type, reference may be made to the article entitled "BICMOS technology" published in the TLE magazine No. 544 in May 1989 by Pierre Hirschauer.

Furthermore, as represented in FIG. 4, in which the functional elements of the preceding FIGS. 1a, 2a and 3a have been represented, the TTL-CMOS output stage which is the subject of the present invention may advantageously comprise auxiliary switching transistors denoted 11, 12, 13 making it possible to anticipate the switching command of the bipolar transistor 1 and of the MOS transistor 2. It will be noted that the auxiliary switching transistors advantageously consist of MOS-type transistors, and that these transistors, placed respectively in switching position between the base of the bipolar transistor 1, auxiliary transistors 11 and 13, and between the gate of the MOS transistor 2 and the reference voltage VSS essentially make it possible to anticipate the switching of the bipolar transistors 1 and MOS transistor 2 by the switching time of the inverters, the auxiliary transistors 12 and 13 being controlled by the input logic signal, i.e. prior to the switching of the inverter 3, and the transistor 11 being controlled by the input voltage of the inverter 5, or by the voltage applied to the gate of the MOS transistor 2. Finally it will be noted that as far as the auxiliary MOS transistor 8 is concerned, which makes it possible to provide switching at the CMOS level, the latter may be represented by one or two transistors in cascade without drawback.

Finally it will be noted that the inverters 3 and 5 may also consist of three-state inverters of conventional type.

Thus a TTL-CMOS output stage has been described which is particularly advantageous in that, by implementing a minor modification, the presence or absence of the auxiliary switching transistor, the compatibility of the output signals generated, either at the TTL level or at the CMOS level, may be ensured.

I claim:

1. TTL-CMOS output, having an input and an output terminal, for an integrated circuit, comprising:
   a bipolar transistor and a MOS transistor connected in series between a power supply voltage and a reference voltage, the common point of said bipolar transistor and of said MOS transistor forming said output terminal of said TTL-CMOS output stage;
   a first switching control input channel comprising a first inverter, whose input constitutes the input terminal of said TTL-CMOS stage and whose output is linked to the gate of said MOS transistor by means of a first resistor; and
   a second switching control input channel comprising a second inverter, whose input is linked to the output of said first inverter and whose output is linked to the base of said bipolar transistor by means of a second resistor, said first and second resistors having a value determined so as to limit, on the one hand, the transient current on switching and, on the other hand, the mean current supplied by said bipolar transistor.

2. Output stage according to claim 1, wherein said first and second inverters are each formed by a BIC-MOS inverter, and a CMOS inverter respectively.

3. Output stage according to claim 1, wherein said second switching control input channel further comprises, downstream of said second inverter, a diode connected in series between said second inverter and said second resistor, which makes it possible to bring the value of the high logic level at the output of said output stage back to the value VDD-2Vbe, where VDD designates the value of said power supply voltage and Vbe represents the value of the base-emitter voltage of said bipolar transistor in the conducting state, thereby increasing the switching speed at the TTL level.

4. Output stage according to claim 3, wherein said diode is formed by another bipolar transistor, identical to said bipolar transistor, whose base and collector are linked in short-circuit.

5. Output stage according to claim 1, wherein said output stage further comprises an auxiliary MOS transistor whose drain electrode is linked to the power supply voltage VDD, whose source electrode is linked to said common point of said bipolar transistor and said MOS transistor and whose gate electrode is linked to the output of said first inverter, which makes it possible, when said auxiliary transistor enters into conduction, to impose the value of the power supply voltage on the output point of said output stage, thereby ensuring switching compatibility at the CMOS level.

6. Output stage according to claim 1, wherein said bipolar transistor is an NPN transistor, said MOS transistor being an NMOS transistor.

7. Output stage according to claim 5, wherein said auxiliary MOS transistor is a PMOS transistor.

8. Output stage according to claim 5, further comprising auxiliary switching transistors, said auxiliary switching transistors each being connected between said reference voltage and one of the base of said bipolar transistor and the gate of said MOS transistor, making it possible to anticipate the switching command of the bipolar transistor and of said MOS transistor.

9. Output stage according to claim 5, further comprising:
   a first auxiliary switching transistor including a drain electrode linked to a base of said bipolar transistor, a source electrode linked to said reference voltage, and a gate electrode linked to the output of said first inverter;
   a second auxiliary switching transistor including a drain electrode linked to a gate of said MOS transistor, a source electrode linked to said reference voltage, and a gate electrode linked to said input terminal; and
   a third auxiliary switching transistor including a drain electrode linked to said base of said bipolar transistor, a source electrode linked to said reference voltage, and a gate electrode linked to said input terminal, making it possible to anticipate the switching command of said bipolar transistor and of said MOS transistor.

* * * * *